United States Patent
Rao et al.

(10) Patent No.: US 8,400,822 B2
(45) Date of Patent: Mar. 19, 2013

(54) MULTI-PORT NON-VOLATILE MEMORY THAT INCLUDES A RESISTIVE MEMORY ELEMENT

(75) Inventors: Hari M. Rao, San Diego, CA (US); Jung Pill Kim, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 296 days.

(21) Appl. No.: 12/728,337

(22) Filed: Mar. 22, 2010

(65) Prior Publication Data

US 2011/0228594 A1  Sep. 22, 2011

(51) Int. Cl.
*G11C 11/00* (2006.01)

(52) U.S. Cl. .................. 365/158; 365/230.05

(58) Field of Classification Search ............ 365/158, 365/230.05, 148, 189.04
See application file for complete search history.

(56) References Cited

U.S. PATENT DOCUMENTS

| | | | |
|---|---|---|---|
| 5,847,998 A | 12/1998 | Van Buskirk | |
| 5,923,593 A * | 7/1999 | Hsu et al. | 365/189.04 |
| 6,091,629 A * | 7/2000 | Osada et al. | 365/156 |
| 6,751,706 B2 | 6/2004 | Chauvel et al. | |
| 6,760,249 B2 * | 7/2004 | Chien | 365/154 |
| 6,918,017 B1 | 7/2005 | Lemke | |
| 7,038,938 B2 * | 5/2006 | Kang | 365/148 |
| 7,184,359 B1 | 2/2007 | Bridgewater et al. | |
| 7,307,884 B2 | 12/2007 | Guterman | |
| 7,345,919 B2 | 3/2008 | Honda et al. | |
| 2003/0223283 A1 | 12/2003 | Kunikiyo | |
| 2006/0221663 A1 | 10/2006 | Roehr | |
| 2008/0002453 A1 * | 1/2008 | Liaw | 365/104 |
| 2008/0084736 A1 | 4/2008 | Lee et al. | |
| 2008/0198681 A1 * | 8/2008 | Kenkare et al. | 365/230.05 |
| 2009/0010037 A1 * | 1/2009 | Kang et al. | 365/145 |
| 2010/0072530 A1 | 3/2010 | Takizawa et al. | |
| 2010/0195362 A1 | 8/2010 | Norman | |
| 2010/0220527 A1 | 9/2010 | Norman | |
| 2011/0228595 A1 * | 9/2011 | Rao et al. | 365/158 |

FOREIGN PATENT DOCUMENTS

WO   WO2009122519 A1   10/2009

OTHER PUBLICATIONS

International Search Report and Written Opinion—PCT/US2011/029483—ISA/EPO—May 10, 2011.

* cited by examiner

*Primary Examiner* — Vu Le

(74) *Attorney, Agent, or Firm* — Sam Talpalatsky; Nicholas J. Pauley; Jonathan T. Velasco

(57) ABSTRACT

A system and method to access a multi-port non-volatile memory that includes a resistive memory element is disclosed. In a particular embodiment, a multi-port non-volatile memory device is disclosed that includes a resistive memory cell and multiple ports coupled to the resistive memory cell.

42 Claims, 5 Drawing Sheets

MULTI-PORT NON-VOLATILE MEMORY THAT INCLUDES A RESISTIVE MEMORY ELEMENT

I. FIELD

The present disclosure is generally related to multi-port memory.

II. DESCRIPTION OF RELATED ART

Advances in technology have resulted in smaller and more powerful computing devices. For example, there currently exist a variety of portable personal computing devices, including wireless computing devices, such as wireless telephones, personal digital assistants (PDAs), and paging devices that are small, lightweight, and easily carried by users. More specifically, wireless telephones, such as cellular telephones and Internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application that can be used to access the Internet. As such, these wireless telephones can include significant computing capabilities.

The computing capabilities of a processor may be increased through the use of multiple ports in random access memory (RAM) cells. Multiple ports enable multiple agents to read and write simultaneously by providing multiple read and write access mechanisms to the memory. For example, in a central processing unit (CPU) system, multiple agents may attempt to access bits in a register file in the same processor clock cycle. With multiple ports, a first agent does not need to wait for a second agent to complete a read operation before the first agent is able to conduct a read operation. Enabling both agents to access the memory via different ports enables the multi-port RAM to provide faster access times and reduces memory latency.

Adding multiple ports to each memory cell of a RAM device increases the size and complexity of the device. The increase in size due to adding additional ports may depend upon the type of the memory device. For example, adding an additional write port to a single port static random access memory (SRAM) cell to form a dual-port SRAM cell typically involves additional circuitry. Operation of a larger memory cell consumes additional power and produces additional heat. The additional power is disadvantageous in many electronic devices.

III. SUMMARY

In a particular embodiment, a multi-port magnetoresistive random access memory (MRAM) device is disclosed that has a smaller size than a standard multi-port SRAM device. In addition to the advantage of a reduced size multi-port cell, the multi-port MRAM device includes non-volatile memory that enables the use of an instant-on architecture.

In a particular embodiment, a multi-port non-volatile memory device is disclosed that includes a resistive memory cell and multiple ports coupled to the resistive memory cell.

In another particular embodiment, a method is disclosed that includes executing a first memory operation with respect to a first memory cell while executing a second memory operation with respect to a second memory cell. The first memory operation is via a first port and the second memory operation is via a second port. The first memory cell includes a first resistive memory structure and the second memory cell includes a second resistive memory structure. The first memory cell and the second memory cell are each accessible via the first port and the second port.

In another particular embodiment, a multi-port non-volatile memory is disclosed that includes a memory array that includes a plurality of memory cells. The multi-port non-volatile memory also includes multiple ports coupled to the memory array. At least one of the plurality of memory cells includes a resistive memory element. Each of the multiple ports is operable to access any of the memory cells. At least two of the multiple ports can be used to perform a memory operation concurrently.

In another particular embodiment, the multi-port non-volatile memory includes a memory array that includes a plurality of memory cells. The multi-port non-volatile memory also includes multiple ports coupled to the memory array. Each of the multiple ports is operable to access any of the memory cells. At least two of the multiple ports can be used to perform a memory operation concurrently. At least one of the ports is a write port.

One particular advantage provided by at least one of the disclosed embodiments is a reduced size multi-port cell that enables the use of an instant-on architecture. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
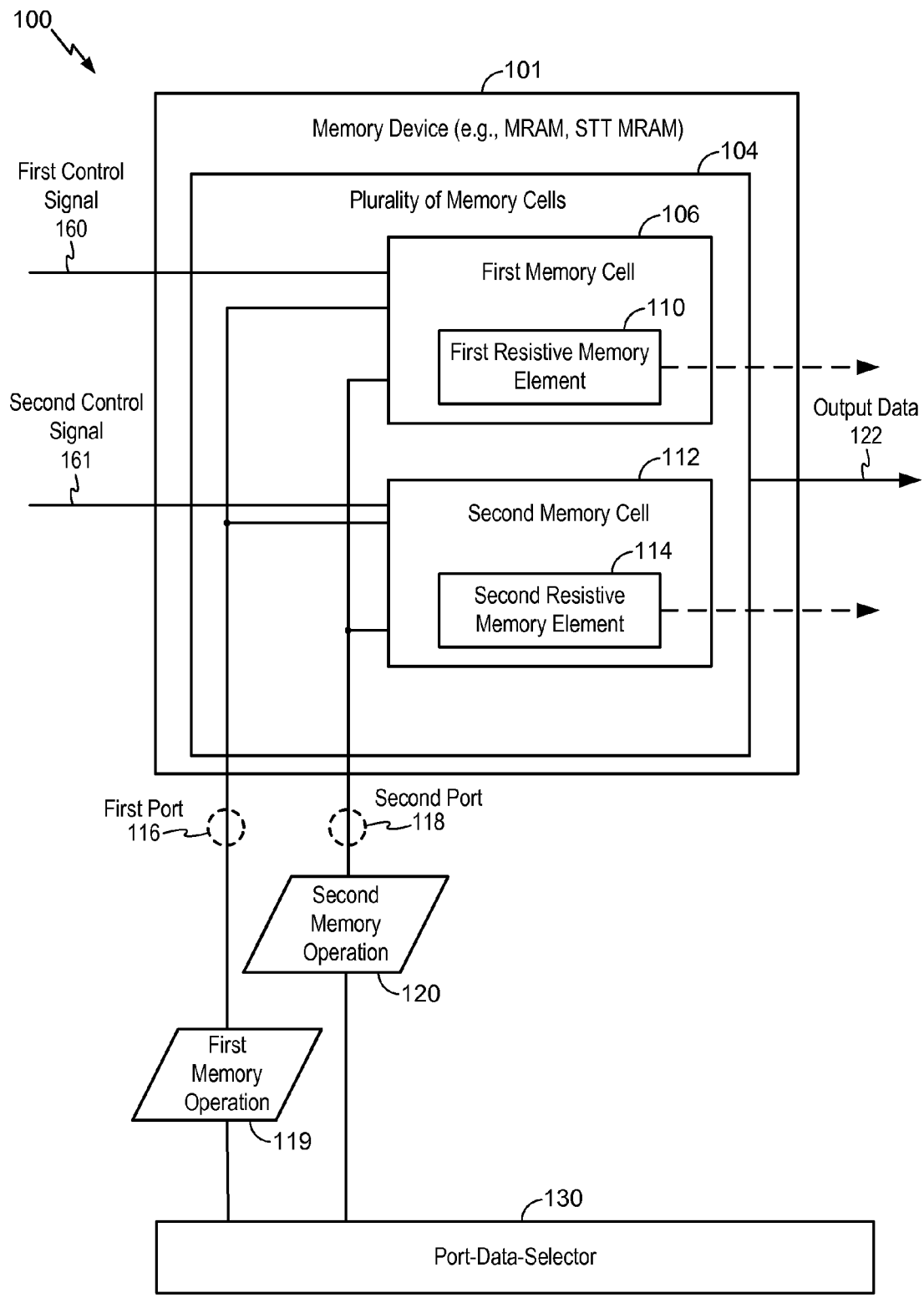
FIG. 1 is a block diagram of a particular illustrative embodiment of a system that includes a memory device with memory cells that include a resistive memory element accessible by multiple ports.

FIG. 1 is a diagram of a first embodiment of a system that includes a memory device with memory cells that include a resistive memory element accessible by multiple ports and is generally designated 100. The system 100 includes a memory device 101 and a port-data-selector 130 coupled to a plurality of memory cells 104 via a first port 116 and a second port 118. In a particular embodiment, the memory device 101 may be a memory array. The plurality of memory cells 104 includes a first memory cell 106 and a second memory cell 112. The first memory cell 106 includes a first resistive memory element 110 and the second memory cell 112 includes a second resistive memory element 114.

In a particular embodiment, the port-data-selector 130 is configured to perform memory operations on the memory cells 106, 112 of the memory device 101 via the first port 116 and the second port 118. For example, the port-data-selector 130 may be configured to perform a first memory operation 119 on the first memory cell 106 via the first port 116. As another example, the port-data-selector 130 may be configured to perform a second memory operation 120 on the second memory cell 112 via the second port 118. In a particular embodiment, at least one of the multiple ports 116, 118 is a read port. At least one of the multiple ports 116, 118 may be a write port.

In a particular embodiment, the plurality of memory cells 104 is responsive to operations performed via the first port 116 and the second port 118. For example, the plurality of memory cells 104 may perform data write operations and data read operations. Each port 116, 118 may be used concurrently to perform the operations. In a particular embodiment, at least two of the multiple ports 116, 118 are capable of being used to perform a memory operation concurrently. For example, the first memory cell 106 may execute the first memory operation 119 via the first port 116 while the second memory cell 112 executes the second memory operation 120 via the second port 118. In a particular embodiment, at least one cell 106, 112 of the plurality of memory cells 104 is configured to be accessed currently via the first port 116 and the second port 118. Alternatively, each memory cell 106, 112 may be configured to enable access to only one port 116, 118 at a time. Port control access may be determined via control signals. For example, in response to a first control signal 160, the first memory cell 106 may enable access to the first resistive memory element 110 via the first port 116 and disable access to the first resistive memory element 110 via the second port 118. As another example, the second memory cell 112 may enable access to the second resistive memory element 114 via the second port 118 and disable access to the second resistive memory element 114 via the first port 116 in response to a second control signal 161.

In a particular embodiment, the plurality of memory cells 104 may be used concurrently to perform different operations. For example, the first memory cell 106 may perform a data write operation while the second memory cell 112 performs a data read operation. The plurality of memory cells 104 may also be used to perform the same type of operation. For example, the first memory cell 106 may perform the data read operation while the second memory cell 112 performs the data read operation. As another example, both the first memory cell 106 and the second memory cell 112 may perform data write operations. Performance of multiple operations on the same memory cell may be blocked. For example, a second data write operation at the first memory cell 106 may be blocked during a first data write operation at the first memory cell 106.

As part of a data write operation, the plurality of memory cells 104 may be configured to store data received from the port-data-selector 130. For example, the first memory cell 106 may store the first data by setting a first resistance value of the first resistive memory element 110 to correspond to a logical "0" or a logical "1" value and the second memory cell 112 may store second data by setting a second resistance value of the second resistive memory element 114.

In a particular embodiment, the first memory cell 106 is responsive to a data read operation to generate output data 122. The output data 122 may correspond to a particular resistive element 110, 114 of the plurality of memory cells 104. For example, the output data 122 may be based on the first resistance value of the first resistive memory element 110. As another example, the output data 122 may be based on the second resistance value of the second resistive memory element 114.

In a particular embodiment, the memory device 101 is a magnetoresistive random access memory that is configured to write data using spin-torque-transfer (STT-MRAM). The memory device 101 may be a single register file and the first memory cell 106 and the second memory cell 112 may each correspond to a bit within the single register file. For example, the first memory cell 108 may be configured to store first state information and the second memory cell 112 may be configured to store second state information.

During operation, the plurality of memory cells 104 is responsive to read and write operations. For example, the first memory cell 106 may receive the first data from the port-data-selector 130 to be stored at the first resistive memory element 110. In response to receiving the first data, the first memory cell 106 may store the first data by setting the first resistance value of the first resistive memory element 110. During a data read operation of the first memory cell 106, the first memory cell 106 may generate the output data 122 based on the first resistance value of the first resistive memory element 110.

In a particular embodiment, the second memory cell 112 receives the second data from the port-data-selector 130 to be stored at the second memory cell 112. In response to receiving the second data, the second memory cell 112 may store the second data as the second resistance value of the second resistive memory element 114. During the read operation of the second memory cell 112, the second memory cell 112 may generate the output data 122 based on the second resistance value of the second resistive memory element 114.

In a particular embodiment, the memory device 101 is utilized as RAM for a processor. Storing state information in the resistive memory elements 110, 114 of the memory device 101 enables the processor to implement an instant-on architecture. With instant-on architecture, the processor has immediate access to state information in RAM without having to load the state information into RAM. Non-volatile memories, such as the first memory cell 106 and the second memory cell 112, enable the memory device 101 to be powered off without losing the stored state information. Powering on the memory device 101 with an instant-on architecture enables the processor to access the stored state information without having to load the state information from an external device functioning as non-volatile memory, thus reducing the start-up time of a system utilizing the processor and the memory device 101.

Figure 2:
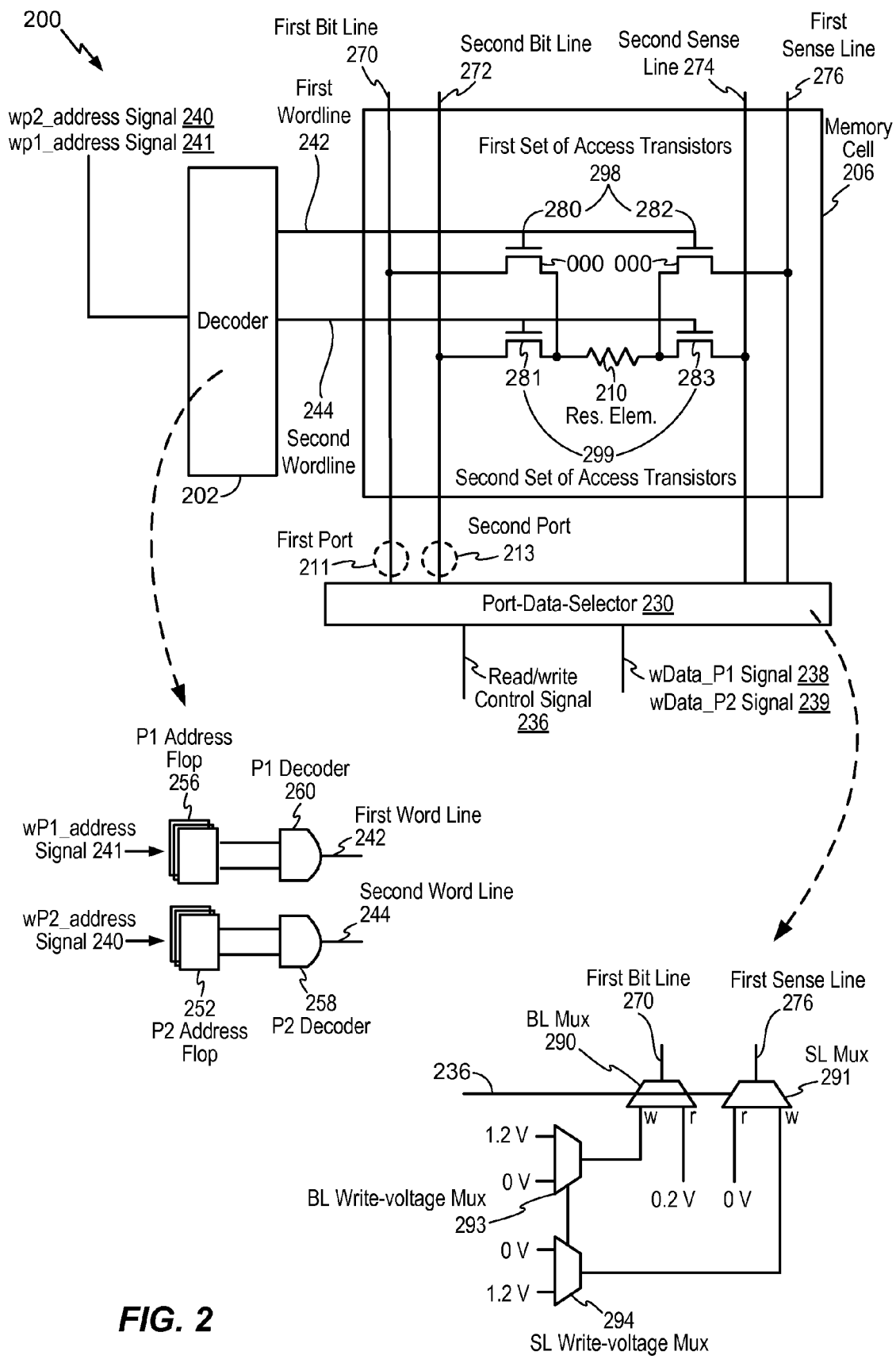
FIG. 2 is a diagram of an illustrative embodiment of a system with a memory cell that includes a resistive memory element accessible by multiple ports.

Referring to FIG. 2, a diagram of a particular embodiment of a system with a cell that includes a resistive memory element accessible by multiple ports is illustrated and is generally designated 200. The system 200 includes a memory cell 206 coupled to a decoder 202 and a port-data-selector 230. The memory cell 206 may be one of the plurality of memory cells 104 of FIG. 1 (e.g., the first memory cell 106 or the second memory cell 112) and the port-data-selector 230 may be the port-data-selector 130 of FIG. 1.

The memory cell 206 includes a resistive memory element 210. For example, the memory cell 206 may be a resistive memory, such as a MRAM or a STT-MRAM. The resistive memory element 210 of the memory cell 206 may be accessible by multiple ports. Multiple ports enable multiple agents to access the same resistive memory element (e.g., the resistive memory element 210). For example, a data value may be stored at the resistive memory element 210 via a first port 211 and may be stored at the resistive memory element 210 via a second port 213.

In a particular embodiment, the decoder 202 is configured to provide control signals (e.g., the first control signal 160 or the second control signal 161 of FIG. 1) via word lines, such as a first wordline 242 and a second wordline 244, to enable the reading and writing of data from the memory cell 206. The decoder 202 may be configured to receive an input address directed to a particular port of the memory cell 206. For example, the input address may be a wp2_address signal 240 that is directed to the second port 213 of the memory cell 206. As another example, the input address may be a wp1_address signal 241 that is directed to the first port 211 of the memory cell 206.

In a particular embodiment, the decoder 202 includes circuitry configured to process the input address based on the port corresponding to the input address. For example, the wP2_address signal 240 corresponding to the second port 213 may be received by the decoder 202. The wp2_address signal 240 may be received at a P2 address flop 252 coupled to a P2 decoder 258. In a particular embodiment, the P2 decoder 258 is an AND gate that is configured to output a high signal in response to receiving two high signals as input from the P2 address flop 252. The P2 decoder 258 may be configured to output the high signal on a word line (e.g., the second wordline 244).

As another example, the decoder 202 may receive the wp1_address signal 241 corresponding to the first port 211. The wp1_address signal 241 may be received at a P1 address flop 256 coupled to a P1 decoder 260. In a particular embodiment, the P1 decoder 260 is an AND gate that is configured to output a high signal in response to receiving two high signals as input from the P1 address flop 256. The P1 decoder 260 may be configured to output a signal on a word line (e.g., the first wordline 242).

In a particular embodiment, the port-data-selector 230 is configured to receive a read/write (r/w) control signal 236. The r/w control signal 236 may indicate whether the memory cell 206 is to perform a read operation or a write operation on a particular port. For example, the r/w control signal 236 may indicate that the read operation is to be performed on the first port 211 of the memory cell 206. As another example, the r/w control signal 236 may indicate that the write operation is to be performed on the second port 213 of the memory cell 206. The port-data-selector 230 may be configured to receive input data for writing data via the ports of the memory cell 206 during the write operation. In a particular embodiment, the input data also indicates a value to be stored. For example, the input data may be a wData_P1 signal 238 that indicates that the first port 211 will be used to write a data value representing a logical value of one. As another example, the input data may be a wData_P2 signal 239 that indicates that the second port 213 will be used to write a data value representing a logical value of zero.

In a particular embodiment, the port-data-selector 230 includes circuitry configured to process the read/write control signal 236 and during the write operation, to process the input data (e.g., the wData_P1 signal 238 and the wData_P2 signal 239). The circuitry of the port-data-selector 230 may include a bit line (BL) multiplexer 290, a sense line (SL) multiplexer 291, a BL write-voltage multiplexer 293, and a SL write-voltage multiplexer 294. Although FIG. 2 depicts the circuitry for processing the first port 211 of the memory cell 206 for ease of explanation, the port-data-selector 230 includes a corresponding BL multiplexer, SL multiplexer, BL write-voltage multiplexer, and SL write-voltage multiplexer for each port of the memory cell 206.

Both the BL multiplexer 290 and the SL multiplexer 291 may be configured to receive the read/write control signal 236. The read/write control signal 236 may determine whether the BL multiplexer 290 and the SL multiplexer 291 will be used in the read operation or the write operation. The output of the BL multiplexer 290 is connected to a bit line (e.g., a first bit line 270) corresponding to the first port 211, and the output of the SL multiplexer 291 is connected to a sense line (e.g., a first sense line 276) corresponding to the first port 211.

In response to receiving the read/write control signal 236 indicating a read operation, the BL multiplexer 290 may be configured to output a voltage of 0.2 V on the first bit line 270 and the SL multiplexer 291 may be configured to output a voltage of 0 V on the first sense line 276 (e.g., the first sense line 276 may be coupled to the ground). In response to the read/write control signal 236 indicating a write operation, the BL multiplexer 290 may be configured to output a voltage to the first bit line 270 based on the BL write-voltage multiplexer 293. In a particular embodiment, the output of the BL write-voltage multiplexer 293 is based on the input data of the port-data-selector 230. For example, the wData_P1 signal 238 may indicate that a logical "1" data value is to be stored in the memory cell 206 via the first port 211. In this case, the BL write-voltage multiplexer 293 may be configured to output 1.2V to the BL multiplexer 290 and the SL write-voltage multiplexer 294 may be configured to output 0V to the SL multiplexer 291. In a particular embodiment, an output of 1.2 V on the first bit line 270 and 0 V on the first sense line 276 results in a representation of a logical "1" value being stored in the resistive element 210 of the memory cell 206.

Alternatively, the wData_P1 signal 238 may indicate that a logical "0" data value is to be stored in the memory cell 206 via the first port 211. In this case, the BL write-voltage multiplexer 293 may be configured to output 0 V to the BL multiplexer 290 and the SL write-voltage multiplexer 294 may be configured to output 1.2 V to the SL multiplexer 291. In a particular embodiment, an output of 0 V on the first bit line 270 and 1.2 V on the first sense line 276 results in a representation of a logical "0" value being stored in the resistive element 210 of the memory cell 206.

In a particular embodiment, the memory cell 206 may include the resistive element 210 configured to store a first representation of data. The memory cell 206 may be configured to enable the first representation of data to be read from the resistive element 210.

In a particular embodiment, the memory cell 206 includes circuitry to store and read the data stored in the resistive element 210. The memory cell 206 may include access transistors that control access to the resistive element 210. The access transistors may be, for example, bipolar transistors or field effect transistors and may be configured as n-type or p-type. The resistive element 210 may be accessible via the first port 211 or the second port 213. Access to the resistive element 210 via the first port 211 is controlled by a first set of access transistors 298. The first set of access transistors 298 includes a BL_P1 access transistor 280 and a SL_P1 access transistor 282. Access of the resistive element 210 through the second port 213 is controlled by a second set of access transistors 299. The second set of access transistors 299 includes a BL_P2 access transistor 281 and a SL_P2 access transistor 283.

The access transistors 280-283 of the memory cell 206 are connected to the word lines from the decoder 202 (e.g., the first wordline 242 and the second wordline 244), bit lines (e.g., the first bit line 270 and a second bit line 272), and sense lines (e.g., a second sense line 274 and the first sense line 276). For example, the BL_P1 access transistor 280 may receive a signal from the first wordline 242 and the first bit line 270. In a particular embodiment, the BL_P1 access transistor 280 may be an n-type JFET that includes a source, a gate, and a drain. In this case, the BL_P1 access transistor 280 may receive the signal from the first wordline 242 at the gate and the signal from the first bit line 270 at the source. The drain of the BL_P1 access transistor 280 may be connected to the resistive element 210.

In a particular embodiment, the source of the SL_P1 access transistor 282 is connected to the resistive element 210, the gate to the first wordline 242, and the drain to the first sense line 276. The source of the BL_P2 access transistor 281 is connected to the second bit line 272, the gate to the second wordline 244, and the drain to the resistive element 210. The source of the SL_P2 access transistor 283 is connected to resistive element 210, the gate to second wordline 244 and the drain to the second sense line 274.

In a particular embodiment, the access transistors 280-283 control access to the resistive element 210 of the memory cell 206. For example, access to the resistive element 210 via the first port 211 is enabled by turning on both the BL_P1 access transistor 280 and the SL_P1 access transistor 282. The BL_P1 access transistor 280 is configured to be turned on by the receipt of a signal from the decoder 202 via the first wordline 242. The SL_P1 access transistor 282 is configured to be turned on by the receipt of a signal over the first wordline 242. Turning on the BL_P1 access transistor 280 and the SL_P1 access transistor 282 may enable current to flow through the resistive element 210 from the first bit line 270 to the first sense line 276 via the first port 211 of the memory cell 206.

As another example, access to the resistive element 210 via the second port 213 is enabled by turning on the BL_P2 access transistor 281 and the SL_P2 access transistor 283. The BL_P2 access transistor 281 is configured to be turned on by the receipt of a signal from the decoder 202 via the second wordline 244. The SL_P2 access transistor 283 is configured to be turned on by the receipt of a signal over the second wordline 244. Turning on the BL_P2 access transistor 281 and the SL_P2 access transistor 283 may enable current to flow through the resistive element 210 from the second bit line 272 to the second sense line 274 via the second port 213 of the memory cell 206.

During the write operation, the decoder 202 may generate an output signal in response to receiving the input address. The output signal may be directed to a particular word line based on a particular port indicated by the input address. For example, the decoder 202 may receive the wp1_address signal 241 at the P1 address flop 256 indicating the first port 211.

In a particular embodiment, the output of the P1 address flop 256 generates an output at the P1 decoder 260. In response to receiving a high signal from the output of the P1 address flop 256, the P1 decoder 260 may generate a high signal on the first wordline 242. A high signal on the first wordline 242 may be received by the BL_P1 access transistor 280 and the SL_P1 access transistor 282.

In a particular embodiment, the read/write control signal 236 received by the port-data-selector 230 indicates that the write operation is to be performed by the memory cell 206. The port-data-selector 230 may receive the input data to be written during the write operation. In response to the read/write control signal 236 indicating the write operation, the BL multiplexer 290 may be configured to output a voltage to the first bit line 270 based on the BL write-voltage multiplexer 293. In a particular embodiment, the output of the BL write-voltage multiplexer 293 is based on the input data of the port-data-selector 230. For example, the wData_P1 signal 238 may indicate that a logical "1" data value is to be stored in the memory cell 206 via the first port 211. In this case, the BL write-voltage multiplexer 293 may output 1.2V to the BL multiplexer 290 and the SL write-voltage multiplexer 294 may output 0V to the SL multiplexer 291.

In a particular embodiment, an output of 1.2 V on the first bit line 270 and 0 V on the first sense line 276 results in a logical "1" representation being stored in the resistive element 210 of the memory cell 206. Alternatively, the wData_P1 signal 238 may indicate that a representation of 0 V is to be stored in the memory cell 206 via the first port 211. In this case, the BL write-voltage multiplexer 293 may be configured to output 0 V to the BL multiplexer 290 and the SL write-voltage multiplexer 294 may be configured to output 1.2 V to the SL multiplexer 291. An output of 0 V on the first bit line 270 and 1.2 V on the first sense line 276 may result in a representation of logical "0" being stored in the resistive element 210 of the memory cell 206.

In a particular embodiment, the resistance value of the resistive element 210 indicates a representation of the data to be stored by the memory cell 206. For example, the resistive element 210 may be a magnetic tunneling junction (MTJ) that includes layers aligned in a particular magnetic orientation. As current passes through the layers, the orientation of a magnetic moment of one or more layers may be changed, increasing or decreasing the resistance of the MTJ.

In a particular embodiment, the first bit line 270 has a first voltage and the first sense line 276 has a second voltage during the write operation on the first port 211. Whether the first voltage is greater than the second voltage may be based on what resistance value is to be written into the resistive element 210. For example, the port-data-selector 230 may provide the first bit line 270 with a voltage of 1.2 V and the first sense line 276 with a voltage of 0 V. In this case, the current would flow from the first bit line 270 through the resistive element 210 to the first sense line 276, aligning at least two magnetic moments of the layers of the MTJ in a parallel orientation. Alternatively, if the voltage of the first bit line 270 is 0 V and the first sense line 276 voltage is 1.2 V, then the current may flow from the first sense line 276 through the resistive element 210 to the first bit line 270, aligning the at least two magnetic moments of the layers of the resistive element 210 in an anti-parallel orientation. If magnetic moments of the layers of the MTJ are in a parallel orientation, then resistance value of the MTJ is smaller than if the magnetic moments were in an anti-parallel orientation. A small resistance value of the MTJ (e.g., the first resistive element 210) may correspond with a first data representation and a large resistance value may correspond with a second data representation.

During the read operation, the decoder 202 may generate an output signal in response to receiving the input address. The output signal may be directed to a particular word line based on a particular port indicated by the input address. For example, the decoder 202 may receive the wp1_address signal 241 at the P1 address flop 256. The output of the P1 address flop 256 may generate an output at the P1 decoder 260. In response to receiving a high signal from the output of the P1 address flop 256, the P1 decoder 260 may generate a high signal on the first wordline 242. A high signal on the first wordline 242 may be received by the BL_P1 access transistor 280 and the SL_P1 access transistor 282.

In a particular embodiment, the read/write control signal 236 received by the port-data-selector 230 indicates that the read operation is to be performed by the memory cell 206. In response to the read/write control signal 236 indicating the read operation, the BL multiplexer 290 may be configured to output a voltage of 0.2 V on the first bit line 270 and the SL multiplexer 291 may be configured to output a voltage of 0 V on the first sense line 276. In a particular embodiment, the first bit line 270 provides the BL_P1 access transistor 280 with 0.2 V and the first sense line 276 provides the SL_P1 access transistor 282 with 0 V. In this case, a read current flows from the first bit line 270 through the resistive element 210 to the first sense line 276.

In a particular embodiment, sensor circuitry connected to the first sense line 276 compares the current on the first sense line 276 to a reference current to determine the resistance value of the resistive element 210. For example, a large current may indicate a small resistance value and a small current may indicate a large resistance value. In this case, the resistance value of the resistive element 210 may serve as an indication of the logical value of the stored element of the resistive element 210. If magnetic moments of the layers of the MTJ (e.g., the resistive element 210) are in a parallel orientation, then the detected resistance would be smaller than if the magnetic moments were in an anti-parallel orientation. For example, a large resistance value may represent a logical value of zero and a small resistance value may represent a logical value of one.

In a particular embodiment, the memory cell 206 is utilized as a RAM cell for a processor. Storing state information (e.g., the wData_P1 signal 238 and the wData_P2 signal 239) as a resistive value in the resistive memory element 210 of the memory cell 206 enables a processor to implement instant-on architecture. With instant-on architecture, the processor has immediate access to state information in RAM without having to load the state information into RAM. A resistive memory element enables the memory cell 206 to power off without losing the resistive values representing the state information. Powering on the memory cell 206 enables the processor to access the stored state information without having to load the state information into RAM from an external device functioning as a non-volatile memory, thus reducing the start-up time of a system utilizing the memory cell 206.

Figure 3:
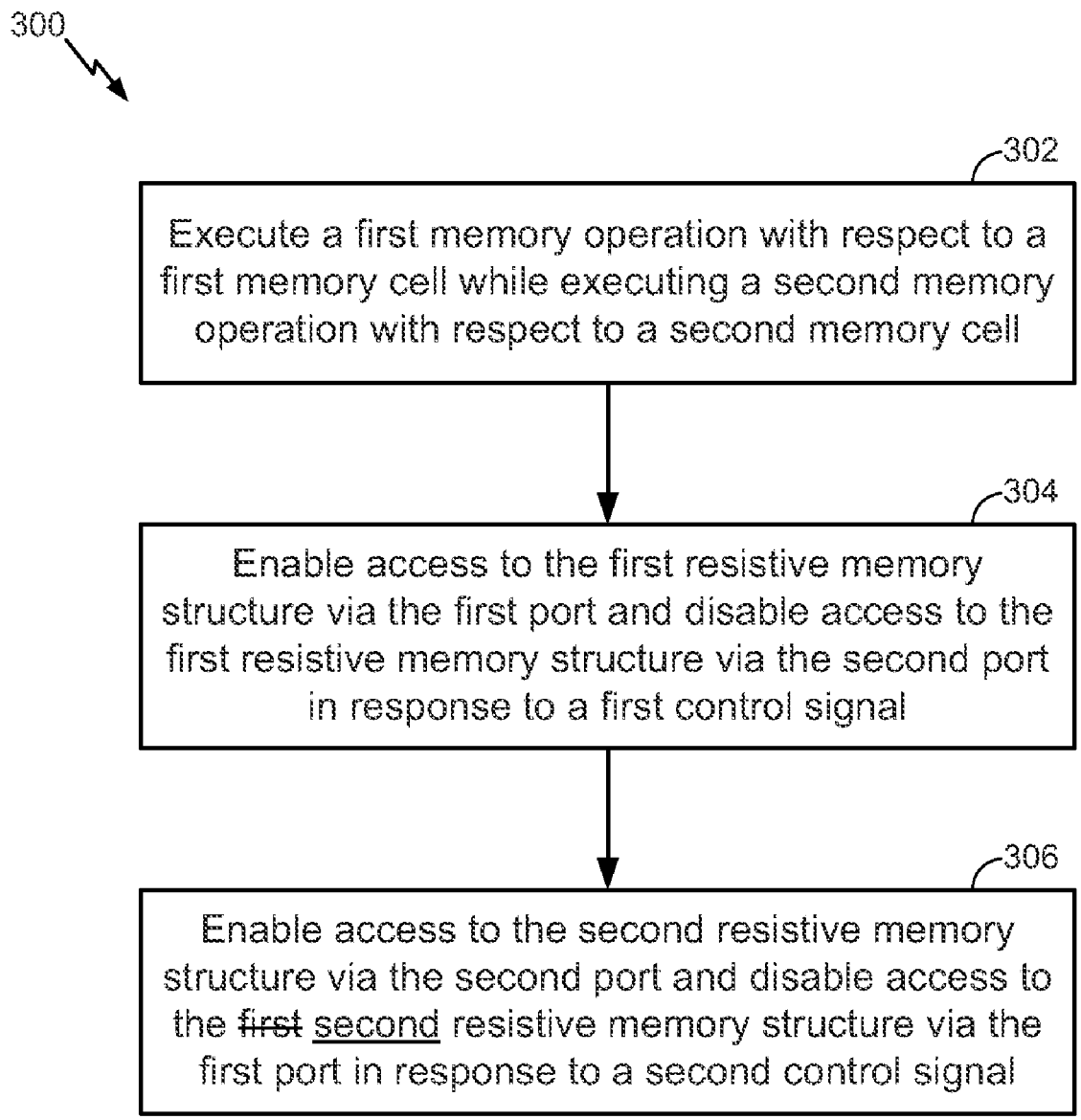
FIG. 3 is a flow chart of a particular illustrative embodiment of a method of operating memory cells that include resistive memory elements accessible by multiple ports.

FIG. 3 is a flow diagram of a first embodiment of a method 300 of operating a memory cell that includes a resistive memory element accessible by multiple ports. In a particular embodiment, the method 300 is performed by any of the systems of FIGS. 1 and 2, or any combination thereof. The method 300 includes executing a first memory operation with respect to a first memory cell while executing a second memory operation with respect to a second memory cell, at 302. For example, the memory cell 106 of FIG. 1 may execute the first memory operation 119 with respect to the first memory cell 106 while executing the second memory operation 120 with respect to the second memory cell 112. In the method 300, the first memory operation is via a first port and the second memory operation is via a second port. For example, the first operation 119 of FIG. 1 may be via the first port 116 and the second memory operation 120 may be via the second port 118.

The first memory cell includes a first resistive memory structure and the second memory cell includes a second resistive memory structure. For example, the first memory cell 106 of FIG. 1 includes the first resistive memory element 110 and the second memory cell 112 includes the second resistive memory element 114. The first memory cell and the second memory cell are each accessible via the first port and the second port.

The method 300 optionally includes enabling access to the first resistive memory structure via the first port and disabling access to the first resistive memory structure via the second port in response to a first control signal, at 304. For example, the first memory cell 106 of FIG. 1 may enable access to the first resistive memory element 110 via the first port 116 and disable access to the first resistive memory element 110 via the second port 118 in response to the first control signal 160. The method 300 may also include enabling access to the second resistive memory structure via the second port and disabling access to the resistive memory structure via the first port in response to a second control signal, at 306. For example, the second memory cell 112 of FIG. 1 may enable access to the second resistive memory structure 114 via the second port 118 and disable access to the second resistive memory element 114 via the first port 116 in response to the second control signal 161.

Figure 4:
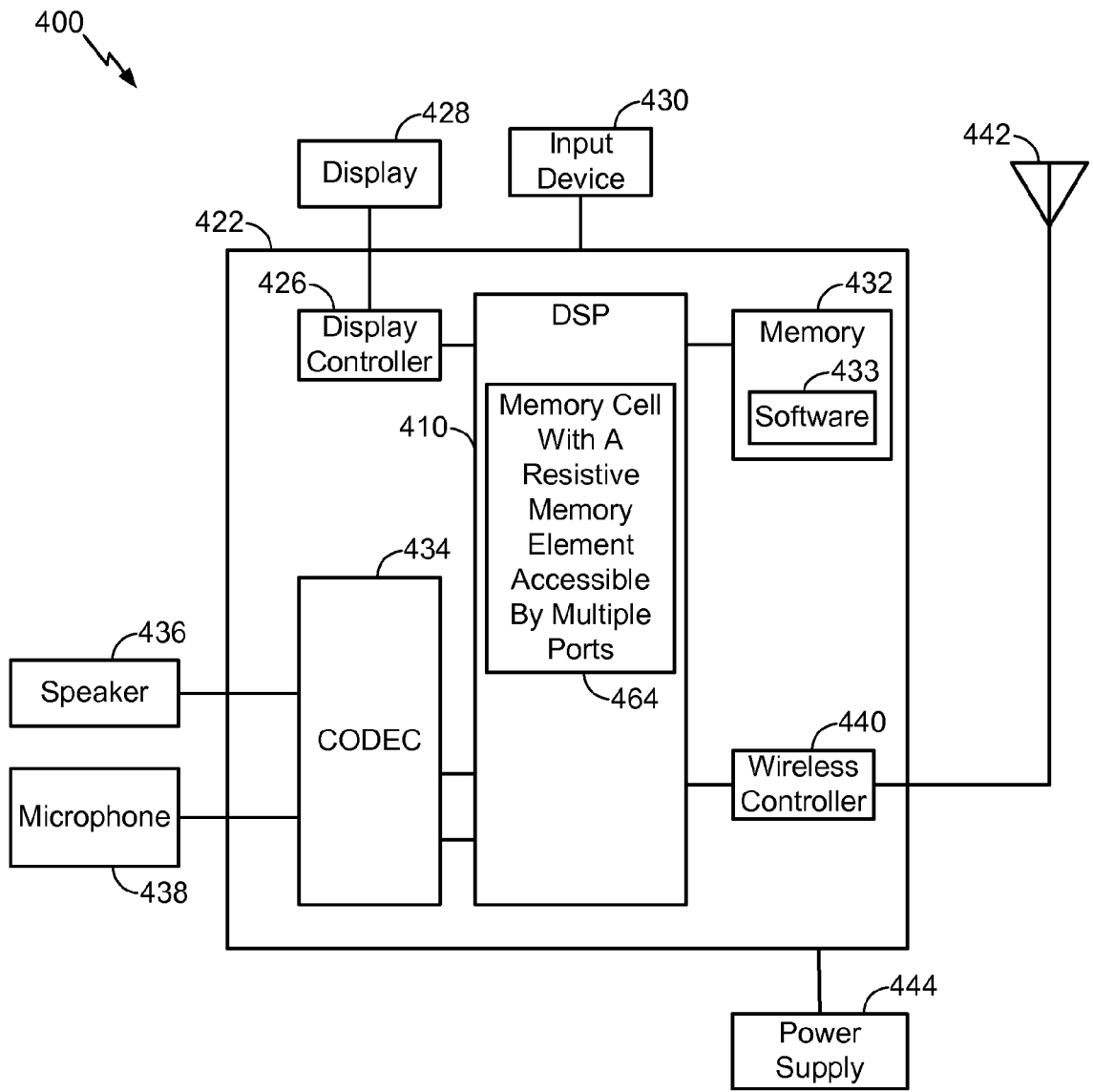
FIG. 4 is a block diagram of a particular embodiment of a wireless communication device that includes a memory cell with a resistive memory element accessible by multiple ports.

FIG. 4 is a block diagram of an embodiment of a wireless communication device 400 having a memory cell with a resistive memory element accessible by multiple ports 464. The wireless communication device 400 may be implemented as a portable wireless electronic device that includes a processor 410, such as a digital signal processor (DSP), coupled to a memory 432. For example, the memory 432 may include a computer readable tangible medium that stores instructions (e.g., software 433) executable by a computer (e.g., the processor 410), the instructions including instructions that are executed by the computer to perform the method 300 of FIG. 3. In an illustrative example, the memory cell with a resistive memory element accessible by multiple ports 464 includes one or more of the components of FIGS. 1-2, operates in accordance with the method of FIG. 3, or any combination thereof. The memory cell with a resistive memory element accessible by multiple ports 464 may be at the processor 410 or may be a separate device.

In one embodiment, a display controller 426 is coupled to the processor 410 and to a display device 428. A coder/decoder (CODEC) 434 can also be coupled to the processor 410. A speaker 436 and a microphone 438 can be coupled to the CODEC 434. A wireless controller 440 can be coupled to the processor 410 and to a wireless antenna 442. The memory cell with a resistive memory element accessible by multiple ports 464 is coupled to the wireless controller 440, the CODEC 434, and the display controller 426. In a particular embodiment, the memory cell with a resistive memory element accessible by multiple ports 464 is configured to store data related to at least one of the display controller 426, the CODEC 434, and the wireless controller 440. The memory cell with a resistive memory element accessible by multiple ports 464 may be configured to operate in an instant-on architecture with the processor 410.

In a particular embodiment, the signal processor 410, the display controller 426, the memory 432, the CODEC 434, and the wireless controller 440 are included in a system-in-package or system-on-chip device 422. In a particular embodiment, an input device 430 and a power supply 444 are coupled to the system-on-chip device 422. Moreover, in a particular embodiment, as illustrated in FIG. 4, the display device 428, the input device 430, the speaker 436, the microphone 438, the wireless antenna 442, and the power supply 444 are external to the system-on-chip device 422. However, each of the display device 428, the input device 430, the speaker 436, the microphone 438, the wireless antenna 442, and the power supply 444 can be coupled to a component of the system-on-chip device 422, such as an interface or a controller.

In another particular embodiment, the system 400 of FIG. 4 may be integrated into one or more electronic devices. As an illustrative, non-limiting example, the one or more electronic devices may be selected from the group of a set top box, a music player, a video player, an entertainment unit, a navigation device, a communications device, a personal digital assistant (PDA), a fixed location data unit, and a computer. As another illustrative, non-limiting example, the one or more electronic devices may be remote units such as mobile phones, hand-held personal communication systems (PCS) units, portable data units such as personal data assistants (PDA), global positioning system (GPS) enabled devices, navigation devices, fixed location data units such as meter reading equipment, any other electronic device, or any combination thereof. The disclosure is not limited to these exemplary units. Embodiments of the disclosure may be suitably employed in any device that includes active integrated circuits including memory and circuitry.

Figure 5:
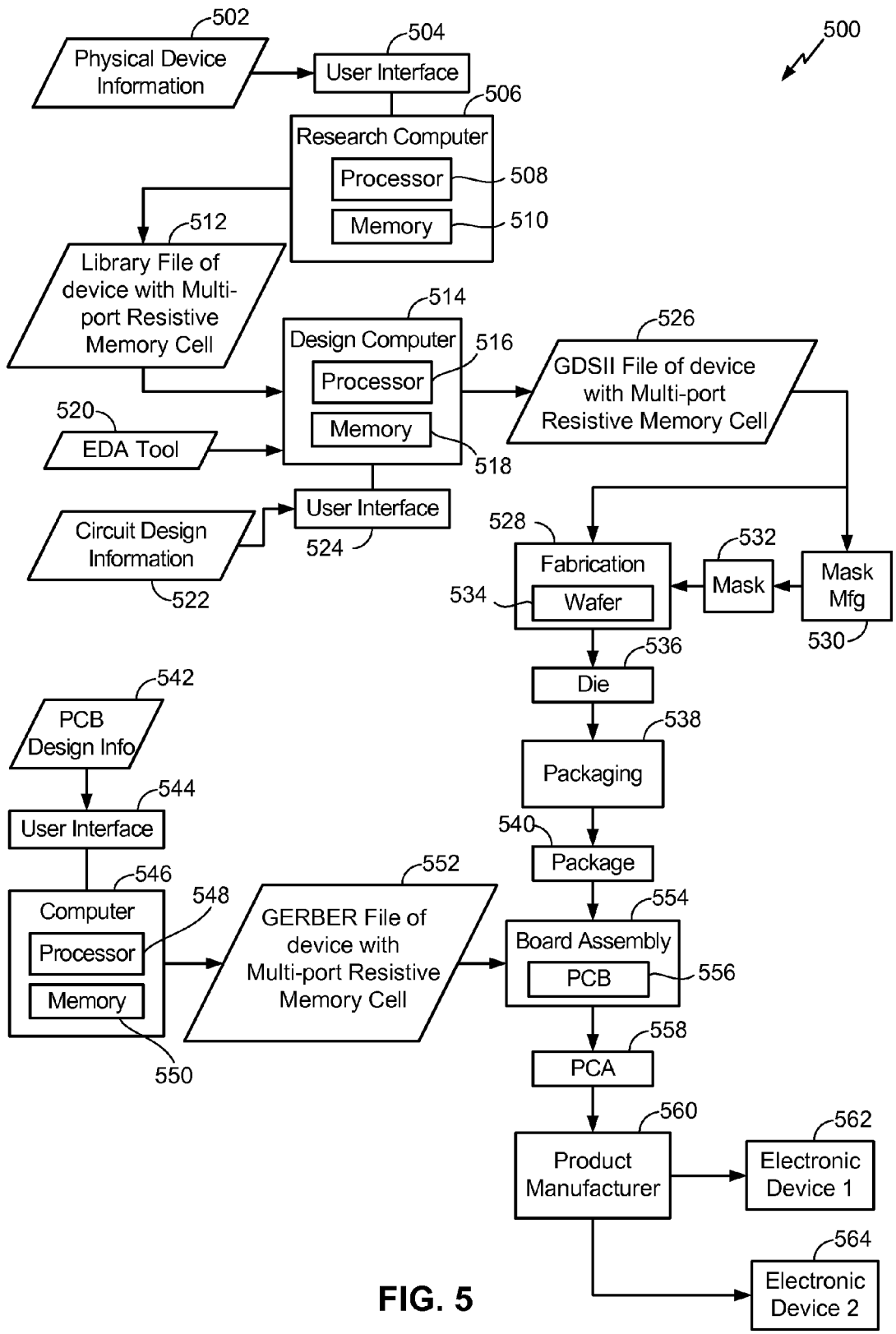
FIG. 5 is a data flow diagram illustrating a manufacturing process for use with a device that includes a memory cell with a resistive memory element accessible by multiple ports.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 5 depicts a particular illustrative embodiment of an electronic device manufacturing process 500.

Physical device information 502 is received at the manufacturing process 500, such as at a research computer 506. The physical device information 502 may include design information representing at least one physical property of a semiconductor device, such as the system 100 of FIG. 1, the system 200 of FIG. 2, or any combination thereof. For example, the physical device information 502 may include physical parameters, material characteristics, and structure information that is entered via a user interface 504 coupled to the research computer 506. The research computer 506 includes a processor 508, such as one or more processing cores, coupled to a computer readable medium such as a memory 510. The memory 510 may store computer readable instructions that are executable to cause the processor 508 to transform the physical device information 502 to comply with a file format and to generate a library file 512.

In a particular embodiment, the library file 512 includes at least one data file including the transformed design information. For example, the library file 512 may include a library of semiconductor devices including a device that includes the memory cell 106 of FIG. 1 (e.g., the system 100 of FIG. 1), a device that includes the memory cell 206 of FIG. 2 (e.g., the system 200 of FIG. 2), or any combination thereof, that is provided to use with an electronic design automation (EDA) tool 520.

The library file 512 may be used in conjunction with the EDA tool 520 at a design computer 514 including a processor 516, such as one or more processing cores, coupled to a memory 518. The EDA tool 520 may be stored as processor executable instructions at the memory 518 to enable a user of the design computer 514 to design a circuit including a device that includes the memory cell 106 of FIG. 1 (e.g., the system 100 of FIG. 1), a device that includes the memory cell 206 of FIG. 2 (e.g., the system 200 of FIG. 2), or any combination thereof, of the library file 512. For example, a user of the design computer 514 may enter circuit design information 522 via a user interface 524 coupled to the design computer 514. The circuit design information 522 may include design information representing at least one physical property of a semiconductor device, such as a device that includes the memory cell 106 of FIG. 1 (e.g., the system 100 of FIG. 1), a device that includes the memory cell 206 of FIG. 2 (e.g., the system 200 of FIG. 2), or any combination thereof. To illustrate, the circuit design property may include identification of particular circuits and relationships to other elements in a circuit design, positioning information, feature size information, interconnection information, or other information representing a physical property of a semiconductor device.

The design computer 514 may be configured to transform the design information, including the circuit design information 522, to comply with a file format. To illustrate, the file formation may include a database binary file format representing planar geometric shapes, text labels, and other information about a circuit layout in a hierarchical format, such as a Graphic Data System (GDSII) file format. The design computer 514 may be configured to generate a data file including the transformed design information, such as a GDSII file 526 that includes information describing the memory cell 106 of FIG. 1, the memory cell 206 of FIG. 2, or any combination thereof, in addition to other circuits or information. To illustrate, the data file may include information corresponding to a system-on-chip (SOC) that includes the memory cell 106 of FIG. 1 and that also includes additional electronic circuits and components within the SOC.

The GDSII file 526 may be received at a fabrication process 528 to manufacture the memory cell 106 of FIG. 1, the memory cell 206 of FIG. 2, or any combination thereof, according to transformed information in the GDSII file 526. For example, a device manufacture process may include providing the GDSII file 526 to a mask manufacturer 530 to create one or more masks, such as masks to be used with photolithography processing, illustrated as a representative mask 532. The mask 532 may be used during the fabrication process to generate one or more wafers 534, which may be tested and separated into dies, such as a representative die 536. The die 536 includes a circuit including a device that includes the memory cell 106 of FIG. 1 (e.g., the system 100 of FIG. 1), a device that includes the memory cell 206 of FIG. 2 (e.g., the system 200 of FIG. 2), or any combination thereof.

The die 536 may be provided to a packaging process 538 where the die 536 is incorporated into a representative package 540. For example, the package 540 may include the single die 536 or multiple dies, such as a system-in-package (SiP) arrangement. The package 540 may be configured to conform to one or more standards or specifications, such as Joint Electron Device Engineering Council (JEDEC) standards.

Information regarding the package 540 may be distributed to various product designers, such as via a component library stored at a computer 546. The computer 546 may include a processor 548, such as one or more processing cores, coupled to a memory 550. A printed circuit board (PCB) tool may be stored as processor executable instructions at the memory 550 to process PCB design information 542 received from a user of the computer 546 via a user interface 544. The PCB design information 542 may include physical positioning information of a packaged semiconductor device on a circuit board, the packaged semiconductor device corresponding to the package 540 including the memory cell 106 of FIG. 1, the memory cell 206 of FIG. 2, or any combination thereof.

The computer 546 may be configured to transform the PCB design information 542 to generate a data file, such as a GERBER file 552 with data that includes physical positioning information of a packaged semiconductor device on a circuit board, as well as layout of electrical connections such as traces and vias, where the packaged semiconductor device corresponds to the package 540 including the memory cell 106 of FIG. 1, the memory cell 206 of FIG. 2, or any combination thereof. In other embodiments, the data file generated by the transformed PCB design information may have a format other than a GERBER format.

The GERBER file 552 may be received at a board assembly process 554 and used to create PCBs, such as a representative PCB 556, manufactured in accordance with the design information stored within the GERBER file 552. For example, the GERBER file 552 may be uploaded to one or more machines to perform various steps of a PCB production process. The PCB 556 may be populated with electronic components including the package 540 to form a representative printed circuit assembly (PCA) 558.

The PCA 558 may be received at a product manufacture process 560 and integrated into one or more electronic devices, such as a first representative electronic device 562 and a second representative electronic device 564. As an illustrative, non-limiting example, the first representative electronic device 562, the second representative electronic device 564, or both, may be selected from the group of a set top box, a music player, a video player, an entertainment unit, a navigation device, a communications device, a personal digital assistant (PDA), a fixed location data unit, and a computer, into which the at least one controllable energy consuming module is integrated. As another illustrative, non-limiting example, one or more of the electronic devices 562 and 564 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 5 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes the memory cell 106 of FIG. 1 (e.g., the system 100 of FIG. 1), a device that includes the memory cell 206 of FIG. 2 (e.g., the system 200 of FIG. 2), or any combination thereof, may be fabricated, processed, and incorporated into an electronic device, as described in the illustrative process 500. One or more aspects of the embodiments disclosed with respect to FIGS. 1-2 may be included at various processing stages, such as within the library file 512, the GDSII file 526, and the GERBER file 552, as well as stored at the memory 510 of the research computer 506, the memory 518 of the design computer 514, the memory 550 of the computer 546, the memory of one or more other computers or processors (not shown) used at the various stages, such as at the board assembly process 554, and also incorporated into one or more other physical embodiments such as the mask 532, the die 536, the package 540, the PCA 558, other products such as prototype circuits or devices (not shown), or any combination thereof. Although various representative stages of production from a physical device design to a final product are depicted, in other embodiments fewer stages may be used or additional stages may be included. Similarly, the process 500 may be performed by a single entity or by one or more entities performing various stages of the process 500.

Those of skill would further appreciate that the various illustrative logical blocks, configurations, modules, circuits, and method steps described in connection with the embodiments disclosed herein may be implemented as electronic hardware, computer software executed by a processing unit, or combinations of both. Various illustrative components, blocks, configurations, modules, circuits, and steps have been described above generally in terms of their functionality. Whether such functionality is implemented as hardware or executable processing instructions depends on the particular application and design constraints imposed on the overall system. Skilled artisans may implement the described functionality in varying ways with each particular application, but such implementation decisions should not be interpreted as causing a departure from the scope of the present disclosure.

A software module may reside in random access memory (RAM), a magnetoresistive random access memory (MRAM), a spin-torque-transfer MRAM (STT-MRAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A memory device comprising:
   a non-volatile resistive memory cell comprising:
      a single resistive memory element;
      a first set of access transistors, wherein the single resistive memory element is coupled in series with a first access transistor of the first set of access transistors and a second access transistor of the first set of access transistors; and
      a second set of access transistors, wherein the single resistive memory element is coupled in series with a first access transistor of the second set of access transistors and a second access transistor of the second set of access transistors; and
   multiple ports coupled to the nonvolatile resistive memory cell,
   wherein each of the multiple ports is configured to enable read operations and write operations with respect to the non-volatile resistive memory cell.

2. The memory device of claim 1, wherein at least one of the multiple ports is a read port.

3. The memory device of claim 1, wherein at least one of the multiple ports is a write port.

4. The memory device of claim 1, wherein the non-volatile resistive memory cell is included in a spin-torque-transfer magnetoresistive random access memory (STT-MRAM).

5. The memory device of claim 1, wherein the first set of access transistors is configured to selectively enable access to the single resistive memory element via a first port of the multiple ports, and the second set of access transistors is configured to selectively enable access to the single resistive memory element via a second port of the multiple ports.

6. The memory device of claim 5, wherein the first set of access transistors is responsive to a first wordline corresponding to the first port of the multiple ports and wherein the second set of access transistors is responsive to a second wordline corresponding to the second port of the multiple ports.

7. The memory device of claim 5, wherein the first set of access transistors is configured to selectively couple the single resistive memory element between a first bit line and a first sense line corresponding to the first port of the multiple ports, and wherein the second set of access transistors is configured to selectively couple the single resistive memory element between a second bit line and a second sense line corresponding to the second port of the multiple ports.

8. The memory device of claim 1, wherein the non-volatile resistive memory cell is integrated in a semiconductor die.

9. The memory device of claim 1, wherein the non-volatile resistive memory cell is integrated into one of a set top box, a music player, a video player, an entertainment unit, a navigation device, a communications device, a personal digital assistant (PDA), a fixed location data unit, or a computer.

10. A memory device comprising:
a memory array including a plurality of non-volatile memory cells; and
multiple ports coupled to the memory array;
wherein a first non-volatile memory cell of the plurality of non-volatile memory cells includes a single resistive memory element, a first set of access transistors, and a second set of access transistors, wherein the single resistive memory element is coupled in series with a first access transistor of the first set of access transistors and a second access transistor of the first set of access transistors, and wherein the single resistive memory element is coupled in series with a first access transistor of the second set of access transistors and a second access transistor of the second set of access transistors;
wherein each of the multiple ports is operable to access any non-volatile memory cell of the plurality of non-volatile memory cells for performing read and write operations; and
wherein two ports of the multiple ports are operable to concurrently perform two memory operations directed to the memory array.

11. An apparatus comprising:
means for storing a data value at a single resistive memory element;
first means for accessing the means for storing via a first port; and
second means for accessing the means for storing via a second port;
wherein the single resistive memory element is coupled in series with a first access transistor of a first set of access transistors and a second access transistor of the first set of access transistors, and wherein the single resistive memory element is coupled in series with a first access transistor of a second set of access transistors and a second access transistor of the second set of access transistors;
wherein the first means for accessing is configured to perform read operations and write operations via the first port; and
wherein the second means for accessing is configured to perform read operations and write operations via the second port.

12. The memory device of claim 1, wherein the non-volatile memory cell further comprises a bit line and a sense line, and wherein the single resistive memory element is coupled in series with the first access transistor of the first set of access transistors and the second access transistor of the first set of access transistors between the bit line and the sense line.

13. The memory device of claim 12, wherein a first terminal of the first access transistor of the first set of access transistors is coupled to the bit line, wherein a second terminal of the first access transistor of the first set of access transistors is coupled to a first terminal of the single resistive memory element, wherein a third terminal of the first access transistor of the first set of access transistors is coupled to a first wordline, wherein a fourth terminal of the second access transistor of the first set of access transistors is coupled to a second terminal of the single resistive memory element, wherein a fifth terminal of the second access transistor of the first set of access transistors is coupled to the sense line, and wherein a sixth terminal of the second access transistor of the first set of access transistors is coupled to a second wordline.

14. The memory device of claim 13, wherein the first wordline and the second wordline are a same wordline.

15. The memory device of claim 13, wherein a first terminal of the first access transistor of the second set of access transistors is coupled to a second bit line, wherein a second terminal of the first access transistor of the second set of access transistors is coupled to the first terminal of the single resistive memory element, wherein a third terminal of the first access transistor of the second set of access transistors is coupled to a third wordline, wherein a fourth terminal of the second access transistor of the second set of access transistors is coupled to the second terminal of the single resistive memory element, wherein a fifth terminal of the second access transistor of the second set of access transistors is coupled to a second sense line, and wherein a sixth terminal of the second access transistor of the second set of access transistors is coupled to a fourth wordline.

16. The memory device of claim 1, further comprising a port-data-selector coupled to each of the multiple ports and configured to perform read and write operations on the resistive memory cell via each of the multiple ports.

17. The memory device of claim 1, further comprising a port-data-selector comprising a sense line multiplexer and is configured to determine whether a first sense line is to be used in one of a read operation and a write operation.

18. The memory device of claim 1, further comprising a port-data-selector comprising a sense line multiplexer, a bit line multiplexer, a bit line write-voltage multiplexer, and a sense line write-voltage multiplexer.

19. The memory device of claim 1, wherein the non-volatile resistive memory cell is included in a register-file.

20. The memory device of claim 1, wherein the single resistive memory element includes a magnetic tunnel junction (MTJ).

21. The memory device of claim 1, wherein the non-volatile resistive memory cell is coupled to a central processing unit and wherein the non-volatile resistive memory cell is configured to enable an instant-on capability of the central processing unit.

22. The memory device of claim 10, wherein the first set of access transistors of the first non-volatile memory cell is operable to enable access to the single resistive memory element of the first non-volatile memory cell via a first port of the multiple ports, and wherein the second set of access transistors of the first non-volatile memory cell is operable to disable access to the single resistive memory element of the first non-volatile memory cell via a second port of the multiple ports.

23. The memory device of claim 22, wherein a first set of access transistors of a second non-volatile memory cell of the plurality of non-volatile memory cells is operable to enable access to a single resistive memory element of the second non-volatile memory cell via the second port of the multiple ports, and wherein a second set of access transistors of the second non-volatile memory cell is operable to disable access to the single resistive memory element of the second non-volatile memory cell via the first port of the multiple ports.

24. The memory device of claim 10, wherein the two memory operations are data read operations, and wherein the data read operations are directed to the first non-volatile memory cell.

25. The memory device of claim 10, wherein the two memory operations include a data write operation and a data read operation, and wherein the data read operation and the data write operation are directed to the first non-volatile memory cell.

26. A non-volatile memory device comprising:
a memory array including a plurality of memory cells; and
multiple ports coupled to the memory array;
wherein at least one of the plurality of memory cells includes a single resistive memory element, a bit line, and a sense line;
wherein the single resistive memory element is coupled in series with a first access transistor and a second access transistor between the bit line and the sense line; and
wherein each of the multiple ports is operable to access any of the plurality of memory cells for performing read and write operations.

27. The non-volatile memory device of claim 26, wherein at least two ports of the multiple ports are operable to perform two memory operations concurrently.

28. The non-volatile memory device of claim 27, wherein the first port is operable to perform a read operation on the first memory cell and the second port is operable to perform a read operation on one of the first memory cell and the second memory cell.

29. The non-volatile memory device of claim 26, further comprising a port-data-selector configured to determine whether the sense line is to be used in one of a read operation and a write operation.

30. The non-volatile memory device of claim 26, further comprising a port-data-selector configured to determine whether the bit line is used in one of a read operation and a write operation.

31. The memory device of claim 16, wherein the port-data-selector comprises:
a bit line multiplexer configured to select a bit line voltage to be applied to a bit line of a particular port of the multiple ports; and
a sense line multiplexer configured to select a sense line voltage to be applied to a sense line of the particular port of the multiple ports.

32. The memory device of claim 31, wherein the bit line voltage is selected from a first plurality of voltages including a first voltage, a second voltage, and a third voltage, and wherein the sense line voltage is selected from a second plurality of voltages including the first voltage and the second voltage.

33. The memory device of claim 31, wherein, when the bit line voltage and the sense line voltage are a same potential, read operations or write operations via the particular port are prohibited.

34. The memory device of claim 1, further comprising a port data selector configured to select a bit line voltage to be applied to a bit line of a particular port of the multiple ports and a sense line voltage to be applied to a sense line of the particular port of the multiple ports, and wherein a first selection of the bit line voltage and the sense line voltage enables a read operation.

35. The memory device of claim 1, further comprising a port data selector configured to select a bit line voltage to be applied to a bit line of a particular port of the multiple ports and a sense line voltage to be applied to a sense line of the particular port of the multiple ports, and wherein a second selection of the bit line voltage and the sense line voltage enables a first write operation associated with writing a logical one value.

36. The memory device of claim 1, further comprising a port data selector configured to select a bit line voltage to be applied to a bit line of a particular port of the multiple ports and a sense line voltage to be applied to a sense line of the particular port of the multiple ports, and wherein a third selection of the bit line voltage and the sense line voltage enables a second write operation associated with writing a logical zero value.

37. The memory device of claim 10, wherein the two memory operations are data read operations, and wherein a first data read operation is directed to the first non-volatile memory cell and a second data read operation is directed to a second non-volatile memory cell of the plurality of non-volatile memory cells.

38. The memory device of claim 10, wherein the two memory operations are a data read operation and a data write operation, and wherein the data read operation is directed to the first non-volatile memory cell and the data write operation is directed to a second non-volatile memory cell of the plurality of non-volatile memory cells.

39. The memory device of claim 10, wherein the two memory operations are a data write operations, and wherein a first data write operation is directed to the first non-volatile memory cell and a second data write operation is directed to a second non-volatile memory cell of the plurality of non-volatile memory cells.

40. The non-volatile memory device of claim 27, wherein a first port of the at least two ports is operable to perform a read operation on a first memory cell of the plurality of memory cells and a second port of the at least two ports is operable to concurrently perform a write operation on the first memory cell or a second memory cell of the plurality of memory cells.

41. The non-volatile memory device of claim 27, wherein a first port of the at least two ports is operable to perform a write operation on a first memory cell of the plurality of memory cells and a second port of the at least two ports is operable to concurrently perform a write operation on a second memory cell of the plurality of memory cells.

42. The non-volatile memory device of claim 27, wherein a first port of the at least two ports is operable to perform a read operation on a first memory cell of the plurality of memory cells and a second port of the at least two ports is operable to concurrently perform a read operation on the first memory cell or a second memory cell of the plurality of memory cells.

* * * * *